US010172252B1

United States Patent
Chen et al.

(10) Patent No.: US 10,172,252 B1
(45) Date of Patent: Jan. 1, 2019

(54) INFORMATION HANDLING SYSTEM HAVING AN ERGONOMIC PLUNGER FOR A SERVER PLANAR BOARD

(71) Applicant: DELL PRODUCTS, LP, Round Rock, TX (US)

(72) Inventors: Yu-Lin Chen, Taipei (TW); Liang-Chun Ma, Taipei (TW); Chun-Cheng Lin, Taipei (TW)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/714,655

(22) Filed: Sep. 25, 2017

(51) Int. Cl.
*F16B 5/02* (2006.01)
*H05K 7/14* (2006.01)

(52) U.S. Cl.
CPC ......... *H05K 7/1487* (2013.01); *F16B 5/0208* (2013.01)

(58) Field of Classification Search
None
See application file for complete search history.

(56) References Cited

U.S. PATENT DOCUMENTS

| | | | | |
|---|---|---|---|---|
| 3,068,737 A * | 12/1962 | Mewse | ................. | F16B 21/165 24/453 |
| 4,114,509 A * | 9/1978 | Poe | ..................... | F16B 19/1081 24/607 |
| 4,674,930 A * | 6/1987 | Poe | ........................ | F16B 5/065 24/606 |
| 4,970,761 A * | 11/1990 | Nakamura | .......... | F16B 19/1081 174/138 D |
| 5,754,412 A * | 5/1998 | Clavin | ................... | H05K 7/142 174/138 D |
| RE36,351 E * | 10/1999 | Yamamoto | .......... | B60R 21/2035 24/453 |
| 6,140,591 A * | 10/2000 | Osborne | ................ | H05K 7/142 174/138 E |
| 6,669,423 B2 * | 12/2003 | Smith | ..................... | G06F 1/183 411/396 |
| 6,752,562 B2 * | 6/2004 | Mills | ..................... | F16B 19/109 24/453 |
| 6,995,982 B2 * | 2/2006 | Gonzalez | ................ | G06F 1/184 361/742 |
| 7,914,225 B2 * | 3/2011 | Hageman | .............. | F16B 19/109 403/322.2 |
| 8,066,461 B2 * | 11/2011 | Travers | ................ | F16B 5/0208 411/108 |
| 9,098,252 B2 * | 8/2015 | Sauer | ................... | H05K 7/1429 |
| 9,248,537 B2 * | 2/2016 | O'Neill | ................. | B23Q 3/103 |
| 9,447,815 B2 * | 9/2016 | Roberts | ................... | F16B 45/00 |

(Continued)

*Primary Examiner* — Xanthia C Cunningham
(74) *Attorney, Agent, or Firm* — Larson Newman, LLP

(57) ABSTRACT

An information handling includes a plunger that secures a server planar board within the information handling system. The plunger includes a nut, a body, a rod, and a cap. The nut tightens toward the body and holds the server planar board between the nut and the body. The rod securely holds the server planar board within the information handling system in response to the plunger being in a locked position, and enables the server planar board to be removed from within the information handling system in response to the plunger being in an unlocked position. The cap includes a handle to provide a surface for a force to be exerted to cause the plunger to move from the locked position to the unlocked position.

17 Claims, 4 Drawing Sheets

(56) References Cited

U.S. PATENT DOCUMENTS

| | | | |
|---|---|---|---|
| 9,703,331 B1 | 7/2017 | Chien et al. | |
| 9,850,928 B2 * | 12/2017 | Bowers | F16B 5/0642 |
| 2003/0156923 A1 * | 8/2003 | Winkler | F16B 7/105 |
| | | | 411/552 |
| 2004/0114333 A1 * | 6/2004 | Gonzalez | G06F 1/184 |
| | | | 361/725 |
| 2004/0161317 A1 * | 8/2004 | Jones | F16B 5/0208 |
| | | | 411/433 |
| 2005/0047890 A1 * | 3/2005 | Gulistan | F16B 5/0208 |
| | | | 411/352 |
| 2006/0254327 A1 * | 11/2006 | Stachowiak, Jr. | F16B 21/165 |
| | | | 70/164 |
| 2008/0279651 A1 * | 11/2008 | Bulow | F16B 5/10 |
| | | | 411/103 |
| 2008/0310118 A1 | 12/2008 | Brocklesby et al. | |
| 2009/0245970 A1 * | 10/2009 | Shepherd | F16B 5/0208 |
| | | | 411/396 |

\* cited by examiner

INFORMATION HANDLING SYSTEM HAVING AN ERGONOMIC PLUNGER FOR A SERVER PLANAR BOARD

FIELD OF THE DISCLOSURE

The present disclosure generally relates to information handling systems, and more particularly relates to an information handling system having an ergonomic plunger for a server planar board.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system may include a plunger that secures a server planar board within the information handling system. The plunger includes a nut, a body, a rod, and a cap. The nut tightens toward the body and holds the server planar board between the nut and the body. The rod securely holds the server planar board within the information handling system when the plunger is in a locked position, and enables the server planar board to be removed from within the information handling system when the plunger is in an unlocked position. The cap includes a handle to provide a surface for a force to be exerted to cause the plunger to move from the locked position to the unlocked position.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
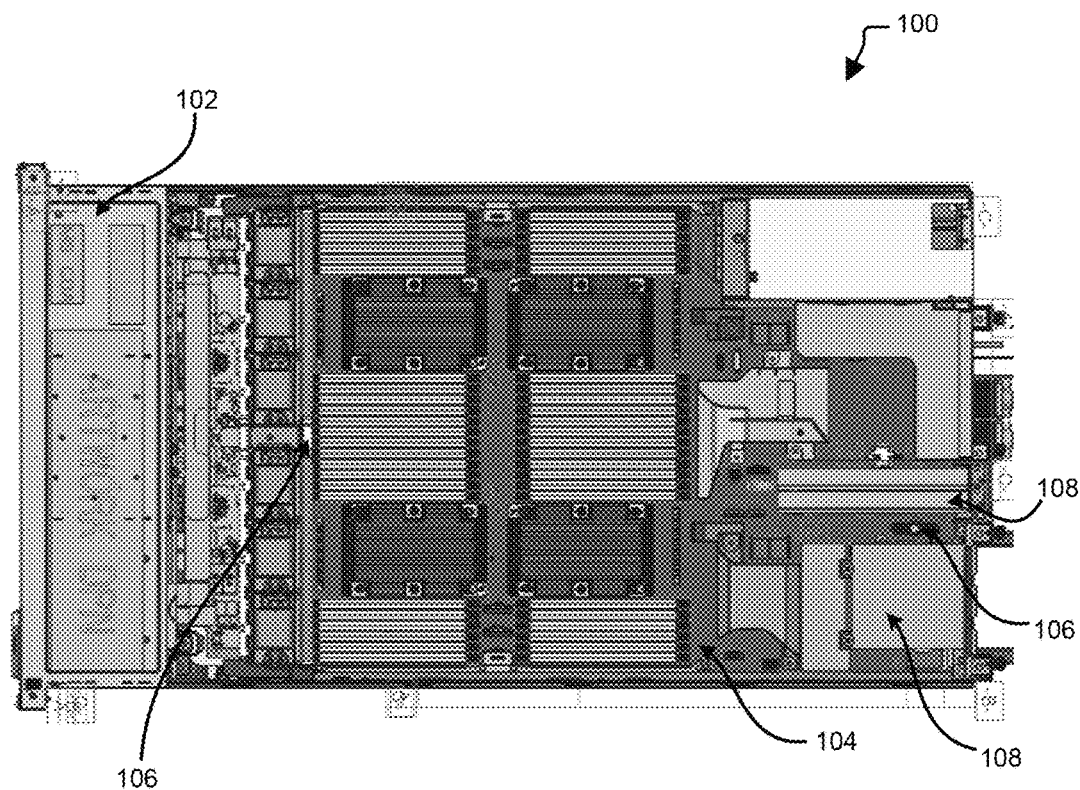
FIG. 1 is a perspective view of a server planar board of an information handling system according to at least one embodiment of the disclosure.

FIG. 1 shows a portion of an information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The information handling system 100 includes a server planar tray 102, a server planar board 104, multiple plungers 106, and components 108. In an embodiment, the components 108 can include a riser board, a network daughter card (NDC), or the like. In an embodiment, the plungers 106 can be utilized to secure the server planar board 104 to the server planar tray 102. In an embodiment, the server planar board 104 can have limited amount of space between the components 108 to accommodate the plungers 106. The plungers 106 can be located at both front and back edges of the server planar board 104 as shown in FIG. 1. The plungers 106 can be placed in a locked position to secure the server planar board 104 to the server planar tray 102, and in an unlocked position to enable the server planar board 104 to be removed from the server planar tray 102.

Figure 2:
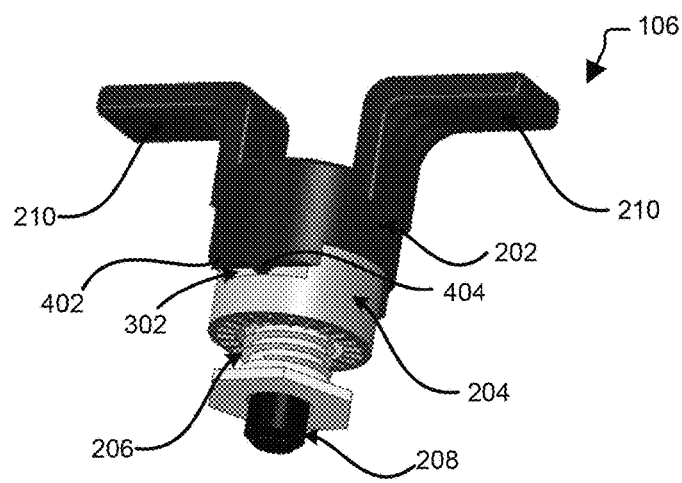
FIG. 2 is a perspective view of an embodiment of a plunger for the server planar board in a locked position according to at least one embodiment of the present disclosure.

FIG. 2 illustrates the plunger 106 in a locked position according to at least one embodiment of the present disclosure. The plunger 106 includes a cap 202, a body 204, a nut 206, and a rod 208. The cap 202 includes handles 210 that extend up from a top surface of the cap 202 for a specific length and angles away from the cap 202 at a right angle, such that the handles 210 extend parallel to a surface of the server planar board 104. In an embodiment, the server planar board 104 is held between the body 204 and the nut 206, such that the nut 206 is in physical contact with a bottom surface of the server planar board 104 and the body 204 is in physical contact with a top surface of the server planar board 104.

Figure 3:
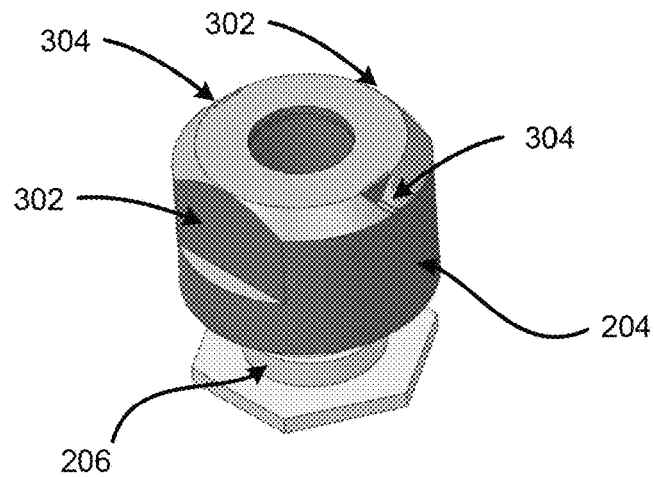
FIG. 3 is a perspective view showing a body and a nut of the plunger according to at least one embodiment of the disclosure.

FIG. 3 shows the body 204 includes cutout portions 302 utilized to place the plunger 106 in the locked position, and indentions 304 utilized to place the plunger in the unlocked position. In an embodiment, the body 204 can include two cutout portions 302 that are located on opposite sides of the body 204 from each other, and can include two indentions 304 that are located on opposite sides of the body 204 from each other. In an embodiment, the cutout portions 302 and the indentions 304 can be separated by equal distances around the edge of the body 204. For example, the cutout portions 302 can be located at a specific locations that are opposite side of the outer edge of the body 204, a first indention 304 can be located between the cutout portions 304, and a second indention 304 can be located between the cutout portions 302 on the opposite side of the outer edge of the body 204 as the first indention. In an embodiment, the cutout portions 302 allow portions of the cap 202 to lower below a top surface of the body 204 when the plunger 106 is placed in the locked position. In an embodiment, the indentions 304 are located on the top surface of the body 204, and can enable the plunger 106 to be held in the unlocked position.

Figure 4:
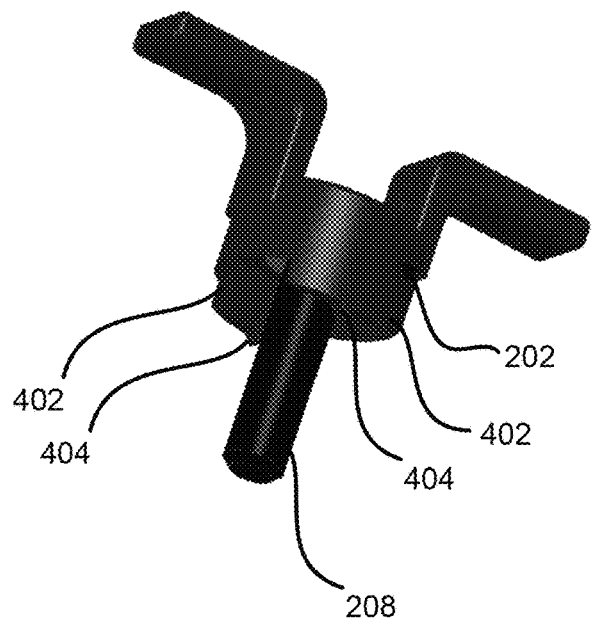
FIG. 4 is a perspective view showing a handle and a rod of the plunger according to at least one embodiment of the present disclosure.
Figure 6:
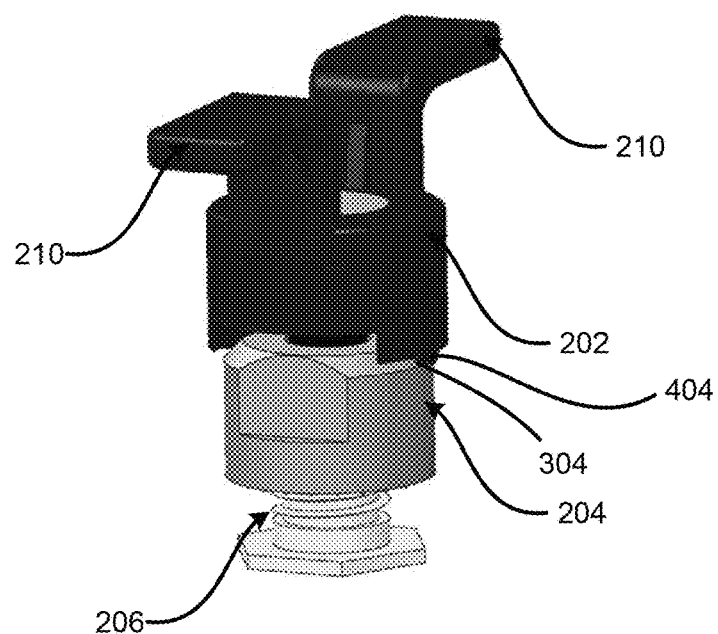
FIG. 6 is a perspective view of the plunger in an unlocked position according to at least one embodiment of the present disclosure.

FIG. 4 shows the rod 208 extends from the cap 202, and the cap 202 includes tabs 402 and points 404. In an embodiment, the cap 202 can include two tabs 402 that are located on opposite sides of the cap 202. The tabs 402 can extend below a lower edge of the cap as shown in FIG. 4. In an embodiment, the points 404 can be triangular in shape with the point of the triangle extending away from the tab 402. In other embodiment, the points 404 can be any other shape, such as square, domed, or the like. In an embodiment, the points 404 and the indentions 304 should be the same shape as the points 402, such that the points 404 can fit within the indentions 304 while the plunger 106 is in the locked position as shown in FIG. 6. In an embodiment, the tabs 402 and points 404 of the cap 202 interact with the cutout portions 302 and the indentions 304 of the body 204 while the plunger 106 is in the locked and unlocked positions.

Referring back to FIG. 2, when the plunger 106 is in the locked position, the tabs 402 and the points 404 the cap 202 extends down over the top surface of the body via the cutout portions 302 of the body 204. In an embodiment, an inner surface of the tabs 402 can be in physical contact with an outer surface of the cutouts 302 while the plunger 106 is in the locked position, such that the cap 202 can no longer rotate with respect to the body 204. The lowering of the cap 202 around the body 204 enables the rod 208 to extend from the nut 208 and is placed in physical contact with the server planar tray 102 to secure the server planar board 104 to the server planar tray 102.

Figure 5:
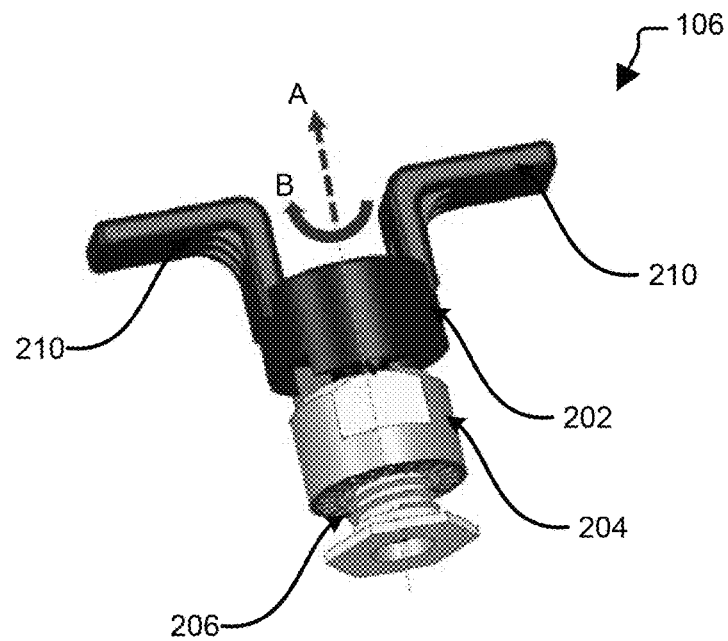
FIG. 5 is a perspective view of the plunger in an intermediate position according to at least one embodiment of the present disclosure.

Referring now to FIG. 5, a user can exert a force on the cap 202 by pulling up on the handles 210, in the direction of the dashed arrow A, to place the plunger 106 in an intermediate position. When the plunger 106 is in the intermediate position, the cap 202 pulls the rod 208 within the nut 206, such that the server planar board 104 can be removed from the server planar tray 102. The user can then rotate the cap 202 as represented by arrow B in FIG. 5. In an embodiment, the user can rotate the cap 202 ninety degrees to switch the plunger 106 from the intermediate position to the unlocked position. After the cap 202 is rotated the points 404 of the cap 202 can be placed within the indentions 304 to hold the plunger in the locked position as shown in FIG. 6.

Figure 7:
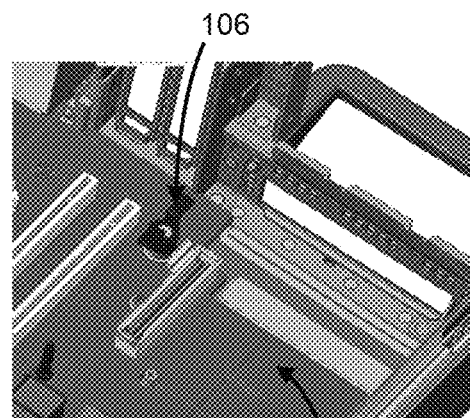
FIG. 7 is a perspective view of showing a first step of removing the server planar board from the information handling system according to an embodiment of the present disclosure.
Figure 8:
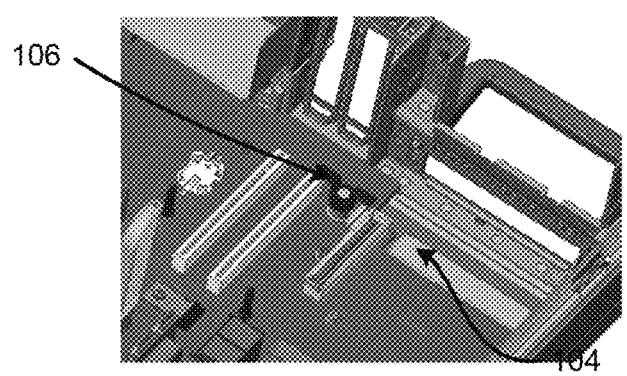
FIG. 8 is a perspective view of showing a second step of removing the server planar board from the information handling system according to at least one embodiment of the present disclosure.
Figure 9:
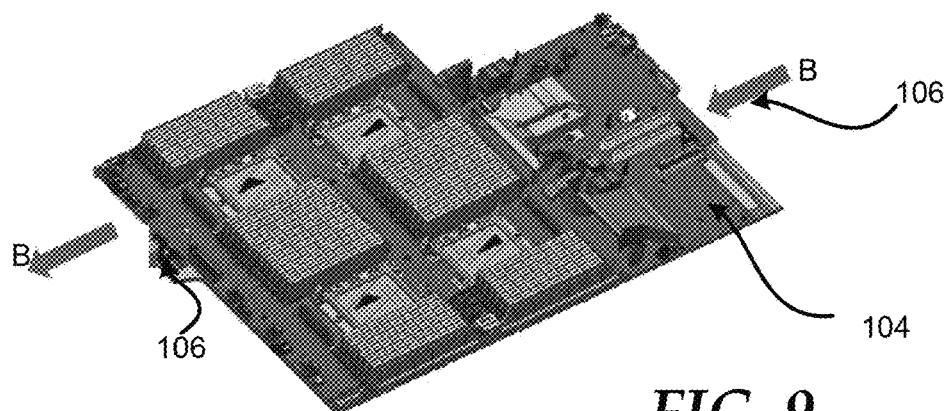
FIG. 9 is a perspective view of showing a third step of removing the server planar board from the information handling system according to an embodiment of the present disclosure.

FIGS. 7-9 illustrate steps of removing the server planar board 104 from the information handling system 100 according to an embodiment of the present disclosure. In an embodiment, the handles 210 of the plunger 106 fit between the components 108 on the server planar board while the plunger 106 is in the locked position. However, when the plunger 106 is rotated to the unlocked position the handles 210 can no longer fit between the components 108. Thus, in a first step of removal of the server planar board 104, the plunger 106 is in the locked position and the components 108 are removed from the server planar board to provide access to the plunger as shown in FIG. 7. The next step includes pulling the plunger 106 upwards to the intermediate position as described above and then rotated to place the plunger 106 in the unlocked position as shown in FIG. 8. Then after the plungers 106 are placed in the unlocked position, such that the rods 208 are no longer in physical contact with the server planar tray 102, the server planar board 104 can be pull from the server planar tray 102 in the direction of arrow B in FIG. 9.

Thus, the plunger 106 is able to be placed in held in the locked position to securely hold the server planar board 104 with the server planar tray 102, and can also be placed and held in the unlocked position to enable the server planar board 104 to be removed from the server planar tray 102. Additionally, the handles 210 of the plunger 106 can enable a user to rotate the plunger 106 from the locked position to the unlocked position in an ergonomic way as compared to a plunger without handles.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A plunger to secure a server planar board within an information handling system, the plunger comprising:
   a nut;
   a body in physical contact with the nut, the nut to tighten toward the body and hold the server planar board between the nut and the body,
   a rod to securely hold the server planar board within the information handling system in response to the plunger being in a locked position, and to enable the server planar board to be removed from within the information handling system in response to the plunger being in an unlocked position; and
   a cap in physical contact with the body and with the rod, the cap including a handle to provide a surface for a force to be exerted to cause the plunger to move from the locked position to the unlocked position, wherein the handle extends a specific distance from a top surface of the cap at which point the handle extends at a ninety degree angle to provide a user with a surface to exert an upward force on the cap to move the plunger from the locked position to the unlocked position.

2. The plunger of claim 1, the body comprises:
   a cutout portion located within an outer surface of the body, the cutout portion to be utilized while the plunger is in the locked position; and
   an indention located in the outer surface of the body a particular distance from the cutout portion, the indention to the utilized while the plunger is in the unlocked position.

3. The plunger of claim 2, the cap comprises:
   a tab extending from a bottom surface of the cap, the tab to be placed in physical contact with the cutout portion when the plunger is in the locked position; and
   a point extending from the tab, the point to be placed in physical contact with the indention when the plunger is in the locked position.

4. The plunger of claim 3, wherein the point extends from the tab in the same shape as the indention extends within the body.

5. The plunger of claim 3, wherein the point being placed within the indention holds the plunger in the unlocked position.

6. The plunger of claim 1, wherein the rod extends below the nut while the plunger is in the locked position, and is located completely within the nut and the body while the plunger is in the unlocked position.

7. An information handling system comprising:
   a server planar board including first and second surfaces; and
   a plunger in physical contact with the server planar board, the plunger to secure the server planar board within the information handling system, the plunger including:
      a nut in physical contact with the first surface of the server planar board;
      a body in physical contact with the nut and with the second surface of the server planar board, the nut to tighten toward the body and hold the server planar board between the nut and the body, the body including:
         a cutout portion located within an outer surface of the body, the cutout portion to be utilized while the plunger is in the locked position; and
         an indention located in the outer surface of the body a particular distance from the cutout portion, the indention to the utilized while the plunger is in the unlocked position;
      a rod to securely hold the server planar board within the information handling system in response to the plunger being in a locked position, and to enable the server planar board to be removed from within the information handling system in response to the plunger being in an unlocked position; and
      a cap in physical contact with the body and with the rod, the cap including a handle to provide a surface for a force to be exerted to cause the plunger to move from the locked position to the unlocked position, the cap including:
         a tab extending from a bottom surface of the cap, the tab to be placed in physical contact with the cutout portion when the plunger is in the locked position; and
         a point extending from the tab, the point to be placed in physical contact with the indention when the plunger is in the locked position.

8. The information handling system of claim 7, wherein the point extends from the tab in the same shape as the indention extends within the body.

9. The information handling system of claim 7, wherein the point being placed within the indention holds the plunger in the unlocked position.

10. The information handling system of claim 7, wherein the rod extends below the nut while the plunger is in the locked position, and is located completely within the nut and the body while the plunger is in the unlocked position.

11. The information handling system of claim 7, wherein the handle extends a specific distance from a top surface of the cap at which point the handle extends at a ninety degree angle to provide a user with a surface to exert an upward force on the cap to move the plunger from the locked position to the unlocked position.

12. An information handling system comprising:
   a server planar board including:
      first and second surfaces; and first and second components; and a plunger in physical contact with the server planar board, the plunger to secure the server planar board within the information handling system, the plunger including:
- a nut in physical contact with the first surface of the server planar board;
- a body in physical contact with the nut and with the second surface of the server planar board, the nut to tighten toward the body and hold the server planar board between the nut and the body,
- a rod to securely hold the server planar board within the information handling system when the plunger is in a locked position, and to enable the server planar board to be removed from within the information handling system when the plunger is in an unlocked position; and
- a cap in physical contact with the body and with the rod, the cap including a handle to provide a surface for a force to be exerted to cause the plunger to move from the locked position to the unlocked position, wherein the handle fits between the first and second components while the plunger is in the locked position and not while the plunger is in the unlocked position.

13. The information handling system of claim 12, wherein the body of the plunger includes:
- a cutout portion located within an outer surface of the body, the cutout portion to be utilized while the plunger is in the locked position; and
- an indention located in the outer surface of the body a particular distance from the cutout portion, the indention to the utilized while the plunger is in the unlocked position.

14. The information handling system of claim 13, wherein the cap of the plunger includes:
- a tab extending from a bottom surface of the cap, the tab to be placed in physical contact with the cutout portion when the plunger is in the locked position; and
- a point extending from the tab, the point to be placed in physical contact with the indention when the plunger is in the locked position.

15. The information handling system of claim 14, wherein the point extends from the tab in the same shape as the indention extends within the body.

16. The information handling system of claim 14, wherein the point being placed within the indention holds the plunger in the unlocked position.

17. The information handling system of claim 12, wherein the rod extends below the nut while the plunger is in the locked position, and is located completely within the nut and the body while the plunger is in the unlocked position.

* * * * *